US009791834B1

(12) United States Patent
Nassar et al.

(10) Patent No.: US 9,791,834 B1
(45) Date of Patent: Oct. 17, 2017

(54) FAST DIGITAL TO TIME CONVERTER LINEARITY CALIBRATION TO IMPROVE CLOCK JITTER PERFORMANCE

(71) Applicant: Intel Corporation, Santa Clara, CA (US)

(72) Inventors: Elias Nassar, Haifa (IL); Samer Nassar, Nazareth (IL); Eyal Fayneh, Givatyim (IL); Rotem Banin, Pardes-hana (IL); Ofir Degani, Haifa (IL); Inbar Falkov, Tel Avia (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/393,115

(22) Filed: Dec. 28, 2016

(51) Int. Cl.
*H03M 1/50* (2006.01)
*G04F 10/00* (2006.01)

(52) U.S. Cl.
CPC .................................. *G04F 10/005* (2013.01)

(58) Field of Classification Search
CPC ......... G04F 10/005; H03M 1/50; H03M 1/60; H04B 17/02
USPC .................................................. 341/120, 166
See application file for complete search history.

(56) References Cited

U.S. PATENT DOCUMENTS 9,209,958 B1 * 12/2015 Palaskas ................ H04B 17/21
9,331,722 B2 * 5/2016 Ravi ....................... H03M 1/84

* cited by examiner

*Primary Examiner* — Khai M Nguyen
(74) *Attorney, Agent, or Firm* — Lowenstein Sandler LLP

(57) ABSTRACT

A system includes a digital-to-time converter (DTC) to generate output signals with phase offsets set by a plurality of DTC input values and a time-to-digital converter (TDC) operatively coupled to the DTC, wherein the TDC has a lower resolution than the DTC. The system also includes a processing component operatively coupled to the DTC and the TDC. The processing device, for each of a plurality of TDC thresholds, determines a DTC input value corresponding to a respective TDC threshold. The processing device may then generate a calibration function based on the determined DTC input values and corresponding TDC thresholds.

20 Claims, 6 Drawing Sheets

FAST DIGITAL TO TIME CONVERTER LINEARITY CALIBRATION TO IMPROVE CLOCK JITTER PERFORMANCE

BACKGROUND

The disclosure relates to the field of clock generators and related circuits using digital to time converters.

BRIEF DESCRIPTION OF THE DRAWINGS

Various implementations of the present disclosure will be understood more fully from the detailed description given below and from the accompanying drawings of various implementations of the invention.

DETAILED DESCRIPTION

Figure 1:
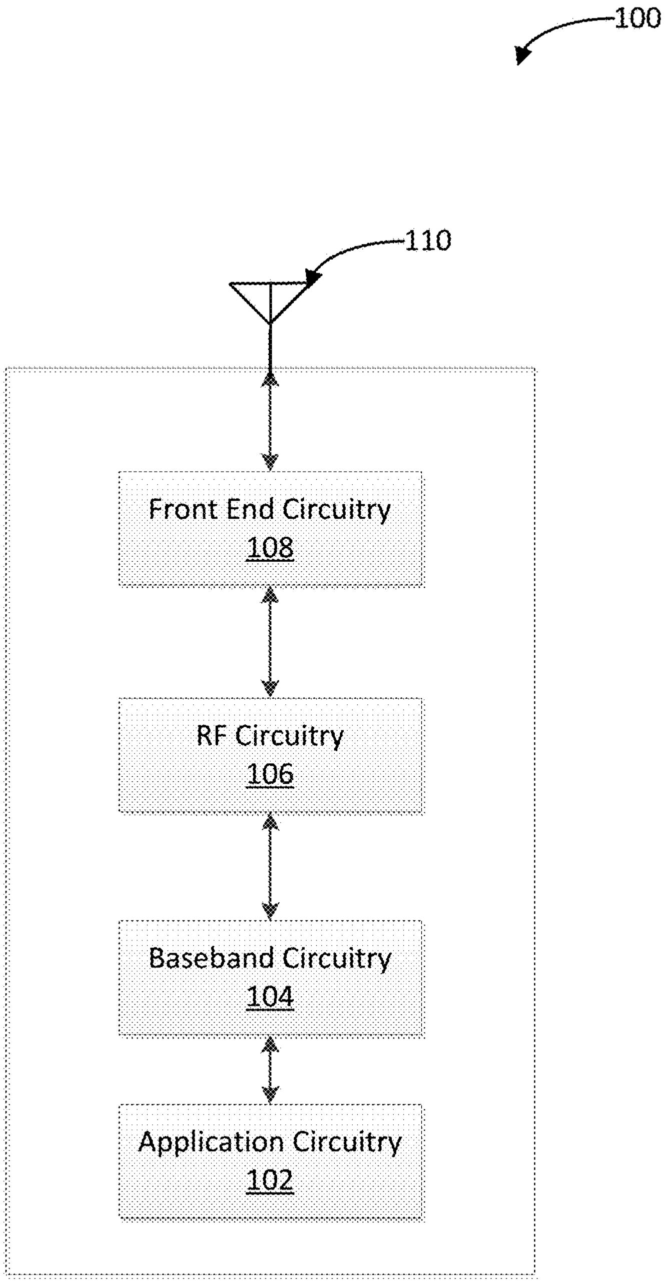
FIG. 1 is a block diagram illustrating exemplary components of an electronic device implementing aspects of the disclosure, according to an exemplary implementation.

In order to perform wireless communications with a network, a mobile device may have a variety of circuits that generate or use clock signals. For example, a mobile device may use a clock signal to coordinate signals within the mobile device, modulate signals to be transmitted by the mobile device, demodulate signals received by the mobile device, or perform other operations within a mobile device. In some mobile device, a digital-to-time converter (DTC) may be used to generate one or more clock signals or perform phase modulation. In some exemplary implementations, a mobile device may have more than one DTC to generate clock signals at different rates or for different components of the mobile device. Furthermore, a DTC may be used in contexts other than a mobile device. For example, the DTC may be used in other computer systems, such as desktops computers, laptop computers, communication systems, internet-of-things applications, system-on-chip applications, or in other devices that may generate clocks or perform phase modulation.

During operation, a DTC receives a DTC input and outputs a clock signal. In some embodiments, the DTC input may be a DTC input, such as a set of binary inputs that indicate a number. The DTC input may indicate a phase offset for the DTC to apply. The DTC may then use the DTC input and a reference clock signal to generate an output signal. In some exemplary implementations, a DTC may be designed to have a linear response to DTC inputs. For example, a DTC may be designed to receive a set number of DTC inputs. The DTC may then have a linear response that increases the phase offset at the same amount as the DTC input is increased.

While a DTC may be designed to have a linear response to a DTC input, the actual output of the DTC in response to each DTC input may not match an idealized linear function. For instance, the change in phase output between a pair of DTC inputs may be higher or lower than expected based on the idealized linear function. However, such inaccuracies in the output of the DTC may increase jitter or reduce the performance of clock generation, phase modulation, or other applications. For example, if the phase offset output by a DTC is not the expected offset, the output may create jitter on a clock signal generated by the DTC. Accordingly, the DTC may be calibrated such that DTC inputs input to a DTC are correlated to measured phase outputs of the DTC rather than to a theoretical linear phase output function. Thus, a system using the DTC may use the calibrated phase output of the DTC to generate clocks, perform phase modulation or demodulation, or in other applications.

In order to measure phase outputs of the DTC, a calibration circuit may measure the DTC phase output in response to each potential DTC input using a high resolution time to digital converter (TDC). However, measuring the DTC phase output at each DTC input would require a TDC with a higher resolution than the DTC. Such a high resolution TDC may use substantial circuit area, use substantial power, and may increase design complexity for a system. Accordingly, a calibration circuit that uses a relatively lower resolution TDC may provide the advantage of reducing circuit area of the calibration circuit, reducing power consumption of the calibration circuit, and reducing design complexity.

To calibrate a DTC using a TDC that has a lower resolution than the DTC, the TDC may determine a DTC input corresponding to particular phase output at a number of phase outputs of the TDC. A calibration system may then use the set of measured phase outputs to generate a function the represents estimated phase outputs for other DTC input. For example, in some exemplary implementations, the set of measured phase outputs may be used to generate a piece-wise linear function that estimates the phase output for DTC inputs that were not in the measured set. In some exemplary implementations, functions other than a piece-wise linear function may be generated to determine DTC inputs corresponding to each phase output.

A DTC calibration circuit may include a component that determines a DTC input that corresponds to TDC threshold. To determine DTC inputs for calibrating a DTC. A TDC may receive a reference clock signal and an output of a DTC. The DTC output and the reference clock signal may be at the same frequency. The TDC may have a number of known thresholds. For example, each TDC threshold may indicate that a certain amount of time has passed between when a first signal was received and when a second signal was received. Thus, the TDC may start measuring a time period when a signal from the reference clock is received. The TDC may then stop measuring the time period when a signal from the DTC is received. The delay between the TDC and the DTC may then be used to determine that the phase offset of the DTC is at least at a certain known threshold that is output by the TDC. By applying different DTC inputs to the DTC, the calibration circuit may determine a DTC input that corresponds to a particular known TDC threshold. In some exemplary implementations, the calibration circuit may determine the DTC input based on a feedback loop that approaches a steady state as a DTC input to a DTC nears a TDC threshold. In some exemplary implementations, the calibration circuit may sweep available DTC inputs to determine one that corresponds to a TDC threshold. In some exemplary implementations, the calibration circuit may use a search process to identify a DTC input that matches a TDC threshold without sweeping each of the DTC inputs. In some exemplary implementations, other processes may be used to identify DTC inputs matching a known TDC threshold.

Based on the DTC inputs that correspond to each of the known TDC thresholds, the calibration circuit may generate a function that provides a phase offset for each of the DTC inputs. For example, for two TDC thresholds that are adjacent in a time domain, the calibration circuit may use the a first DTC input corresponding to the first TDC threshold and a second DTC input corresponding to the second DTC input to determine a number of DTC inputs (steps) between the first DTC input and the second DTC input. A first phase offset corresponding to the first TDS threshold and a second phase offset corresponding to the second TDC threshold may also be used to determine a total amount of phase difference between the thresholds. The total phase offset and the steps between the first DTC input and the second DTC input may then be used to determine an average change in phase offset per DTC input. The average change may then be applied linearly to determine a phase offset for each individual DTC input between the first DTC input and the second DTC input.

The results provided by the calibration circuit may be stored for use by a system that uses the DTC. For example, the DTC inputs and corresponding phase offsets may be stored in a data store. In some exemplary implementations, the phase offsets and DTC inputs may be stored as key-value pairs, such that a processor may identify a DTC input based on a known phase offset that is to be provided by the DTC. In some exemplary implementations, the phase offsets and DTC inputs may be stored in another format. In some exemplary implementations, the calibration circuit may not store phase offsets corresponding to all of the DTC inputs. For example, the calibration circuit may only store the phase offsets and DTC inputs that were measured. Then, a system using the DTC may interpolate a particular DTC input corresponding to a phase offset as needed from the stored pairs. In some exemplary implementations, a representation of the generated function may be stored instead of storing particular values for the phase offsets or the DTC inputs.

While discussed with reference to mobile devices, the DTC and calibrations systems and methods described herein may be used in other computing systems. For example, the systems and methods described herein may be used in desktop or laptop computers, tablets, mobile devices, servers, system on a chip (SoS) applications, or the like. Additionally, while described with reference to clock generation and phase modulation, the DTCs may be used for other applications to provide an output signal at a phase indicated by a DTC input.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed disclosure. However, various aspects of the disclosed implementations may be practiced in other examples that depart from these specific details. In certain instances, descriptions of well-known devices, circuits, and methods are omitted so as not to obscure the description of the present disclosure with unnecessary detail.

As used herein, the term "circuitry" may refer to, be part of, or include an Application Specific Integrated Circuit (ASIC), an electronic circuit, a processors (shared, dedicated, or group), and/or memory device (shared, dedicated, or group) that execute one or more software or firmware programs, a combinational logic circuit, and/or other suitable hardware components that provide the described functionality. In some exemplary implementations, the circuitry may be implemented in, or functions associated with the circuitry may be implemented by, one or more software or firmware modules. In some exemplary implementations, circuitry may include logic, at least partially operable in hardware.

Exemplary implementations described herein may be implemented into a system using any suitably configured hardware and/or software. FIG. 1 illustrates, for one exemplary implementation, a block diagram of example components of a mobile device 100. In some exemplary implementations, the mobile device 100 may include application circuitry 102, baseband circuitry 104, Radio Frequency (RF) circuitry 106, front-end circuitry 108, and one or more antennas 110, coupled together at least as shown. The front-end circuitry 108, baseband circuitry 104, RF circuitry 106 may use a DTC to generate clock signals, perform phase modulation, or perform other functions to enable wireless connectivity. While the digital-to-time calibration systems described herein may be suited for use in a mobile device as shown, though, the DTC may also be used in other computing systems that generate clock signals, modulate signals, or use a DTC for other purposes.

In the mobile device 100, the application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some exemplary implementations, the baseband circuitry 104 may include a second generation (2G) baseband processor, a third generation (3G) baseband processor, a fourth generation (4G) baseband processor, and/or other baseband processor(s) for other existing generations, generations in development, or to be developed in the future (e.g., fifth generation (5G), 6G, or the like). The baseband circuitry 104 may handle various radio control functions that enable communication with one or more radio networks via the RF circuitry 106. The radio control functions may include, but are not limited to, signal modulation/demodulation, encoding/decoding, radio frequency shifting, etc. In some exemplary implementations, the baseband circuitry 104 may determine a channel or frequency for uplink or downlink communications based on messages received from the network. The baseband circuitry 104 may instruct the RF circuitry 106 to monitor particular channels or frequencies as well as to transmit on particular channels or frequencies.

In some exemplary implementations, the baseband circuitry 104 may generate clock signals or perform phase modulation using a DTC. Accordingly, the baseband circuitry 104 may include a DTC calibration system t that determines the phase output of a DTC in response to DTC inputs. For example, the DTC calibration system may include components as described with reference to FIGS. 3 and 5 below to perform operations as described with reference to FIGS. 4 and 6.

In some exemplary implementations, modulation/demodulation circuitry of the baseband circuitry 104 may include Fast-Fourier Transform (FFT), preceding, and/or constellation mapping/demapping functionality. In some exemplary implementations, encoding/decoding circuitry of the baseband circuitry 104 may include convolution, tail-biting convolution, turbo, Viterbi, and/or Low Density Parity Check (LDPC) encoder/decoder functionality. Implementations of modulation/demodulation and encoder/decoder functionality are not limited to these examples and may include other suitable functionality in other implementations.

In some exemplary implementations, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) of the baseband circuitry 104 may be configured to run elements of the protocol stack for signaling of the PHY, MAC, RLC, PDCP, NAS and/or RRC layers. In some exemplary implementations, the baseband circuitry may include one or more audio digital signal processor(s) (DSP). The audio DSP(s) may include elements for compression/decompression and echo cancellation and may include other suitable processing elements in other exemplary implementations. Components of the baseband circuitry may be suitably combined in a single chip, a single chipset, or disposed on a same circuit board in some exemplary implementations. In some exemplary implementations, some or all of the constituent components of the baseband circuitry 104 and the application circuitry 102 may be implemented together such as, for example, on a system on a chip (SoC).

In some exemplary implementations, the baseband circuitry 104 may provide for communication compatible with one or more radio technologies. For example, in some exemplary implementations, the baseband circuitry 104 may support communication with an evolved universal terrestrial radio access network (EUTRAN) and/or other wireless metropolitan area networks (WMAN), a wireless local area network (WLAN), a wireless personal area network (WPAN). Implementations in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various exemplary implementations, the RF circuitry 106 may include switches, filters, amplifiers, etc. to facilitate the communication with the wireless network. RF circuitry 106 may include a receive signal path which may include circuitry to down-convert RF signals received from the front end circuitry 108 and provide baseband signals to the baseband circuitry 104. RF circuitry 106 may also include a transmit signal path which may include circuitry to up-convert baseband signals provided by the baseband circuitry 104 and provide RF output signals to the front end circuitry 108 for transmission.

In some exemplary implementations, the RF circuitry 106 may generate clock signals or perform modulation using a DTC. Accordingly, the RF circuitry 106 may include a DTC calibration system that determines the phase output of a DTC in response to DTC inputs. For example, the DTC calibration system may include components as described with reference to FIGS. 3 and 5 below to perform operations as described with reference to FIGS. 4 and 6.

Front end circuitry 108 may include a receive signal path which may include circuitry configured to operate on RF signals received from one or more antennas 110, amplify the received signals and provide the amplified versions of the received signals to the RF circuitry 106 for further processing. Front end circuitry 108 may also include a transmit signal path which may include circuitry configured to amplify signals for transmission provided by the RF circuitry 106 for transmission by one or more of the one or more antennas 110.

In some exemplary implementations, the front end circuitry 108 may include a TX/RX switch to switch between transmit mode and receive mode operation. The front end circuitry 108 may include a receive signal path and a transmit signal path. The receive signal path of the front end circuitry 108 may include a low-noise amplifier (LNA) to amplify received RF signals and provide the amplified received RF signals as an output (e.g., to the RF circuitry 106). The transmit signal path of the front end circuitry 108 may include a power amplifier (PA) to amplify input RF signals (e.g., provided by RF circuitry 106), and one or more filters to generate RF signals for subsequent transmission (e.g., by one or more of the one or more antennas 110).

In some exemplary implementations, the front end circuitry 108 may generate clock signals or perform modulation using a DTC. Accordingly, the front end circuitry 108 may include a DTC calibration system t that determines the phase output of a DTC in response to DTC inputs. For example, the DTC calibration system may include components as described with reference to FIGS. 3 and 5 below to perform operations as described with reference to FIGS. 4 and 6.

Figure 2:
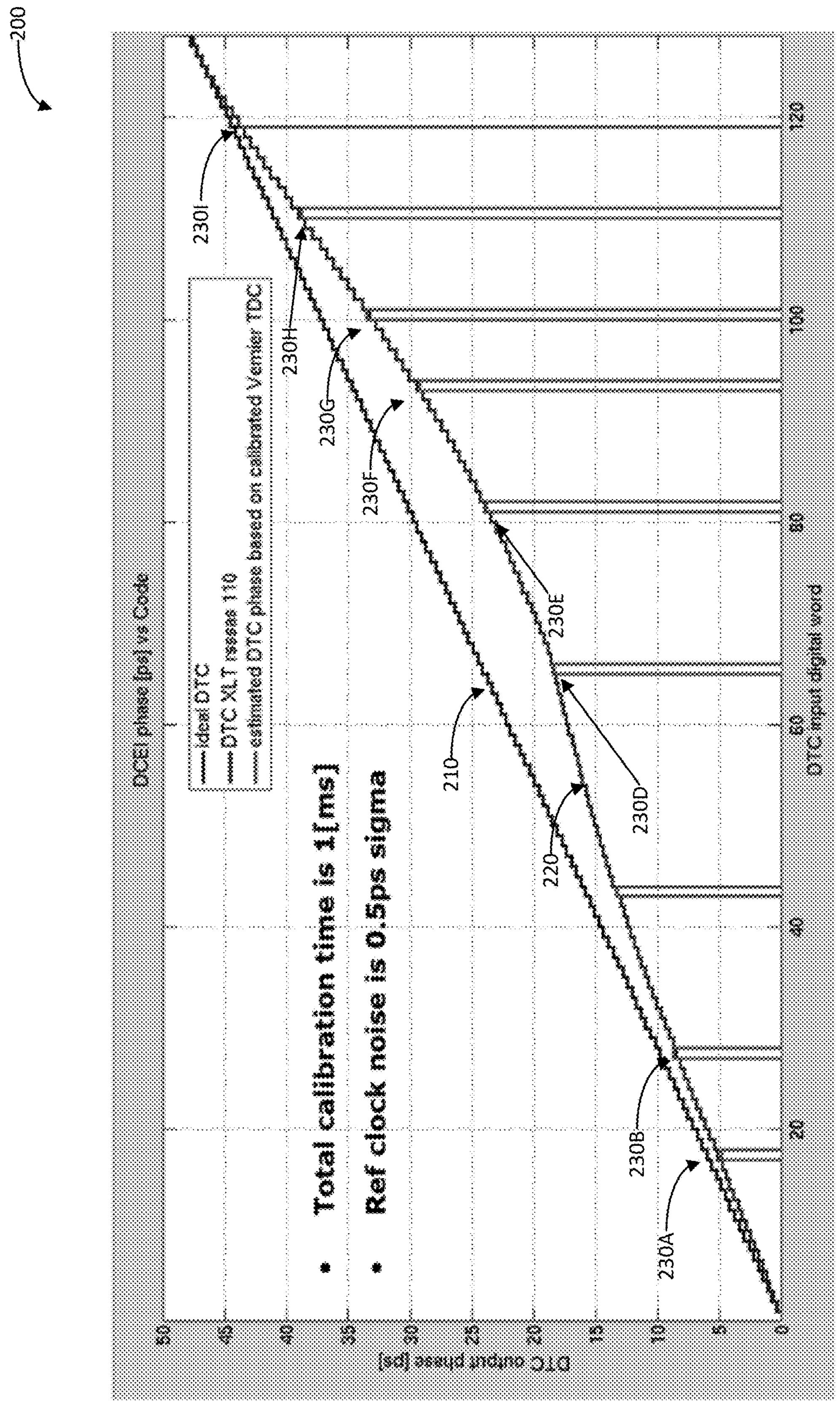
FIG. 2 is a block diagram illustrating exemplary components of an electronic device implementing aspects of the disclosure, according to an exemplary implementation.

FIG. 2 is a graph 200 showing the relationship between a DTC input and a DTC output phase for a theoretical ideal linear DTC and a measured output of a DTC. The line 210 illustrates the ideal DTC output and the line 210 illustrates the actual DTC output. As shown in the graph 200 the phase difference between the ideal DTC and an actual DTC may be significant and can affect performance of a clock signal or phase modulation generated by a DTC.

In order to calibrate a DTC so that the phase output can be select by the correct DTC input, the phase output of the DTC may be measured by a high resolution TDC. However, high resolution TDCs may utilize a large amount of chip space, use more power than smaller TDCs, and increase the complexity of circuit design. Accordingly, a lower resolution TDC may be used to determine a DTC input for a subset of DTC output phases.

In FIG. 2, measured points 230A-230I indicate the DTC input that corresponds to particular thresholds of a TDC. For example, the measured point 230A may be at a point where a DTC input generates a phase offset corresponding to a first known threshold of a TDC. For instance, the first threshold of the TDC is 5 ps as shown in graph 200. Accordingly, a DTC calibration system may determine that a DTC input of 18 generates an output of the DTC with a 5 ps offset.

Accordingly, the measured point 230A may be stored to indicate that the DTC input 18 corresponds to a 5 ps offset.

Measured points 230B-230I may also be generated by determining a DTC input that corresponds to each (or a subset of) of the known thresholds of a TDC. Accordingly, each of the measured points 230A-230I may indicate a DTC input corresponding to a particular phase output of the DTC. The DTC calibration system may then interpolate the measured points 230A-230I to determine an estimated DTC input for particular phase outputs. In some exemplary implementations, the DTC calibration system may generate a piecewise linear function based on the measured points 230A-230I. For instance, if the measured point 230A is at a DTC input of 18 and a phase offset of 5 ps, and the measured point 230B is at a DTC input of 28 and a phase offset of 8 ps, then a portion of a piecewise linear function to calibrate a DTC may be determine by the difference between the measured points 230A, 230B. Thus, that portion of a piecewise linear function may be defined by a slope of (8 ps−5 ps)/(28−18)=0.3, such that a phase offset of the DTC may be determined by the equation "$Offset=0.3DTC_{input}-0.4$" between DTC inputs of 18 and 28. Similar equations may be generated between each of the measured points 230A-230I.

The piecewise linear function generated by a DTC calibration system may be stored as an equation, or as a set of values generated from the equation. Accordingly, set of pairs of DTC inputs and phase offsets may be stored in a data store. Continuing the example above, the DTC calibration system may store a set of pairs as shown in the table below for the DTC inputs between 18 and 28.

| DTC Input | DTC output phase |
|---|---|
| 18 | 5.0 ps |
| 19 | 5.3 ps |
| 20 | 5.6 ps |
| 21 | 5.9 ps |
| 22 | 6.2 ps |
| 23 | 6.5 ps |
| 24 | 6.8 ps |
| 25 | 7.1 ps |
| 26 | 7.4 ps |
| 27 | 7.7 ps |
| 28 | 8.0 ps |

The tables stored by a DTC calibration system may then be used to select a DTC input that corresponds to a particular target phase output. In some exemplary implementations, a subset of the DTC inputs and DTC output phases may be stored and then a particular DTC input may be selected by extrapolating from the stored points. In some exemplary implementations, the piecewise linear function generated by the DTC calibration system may be used to calculate a particular DTC input corresponding to a target phase output. In some exemplary implementations, a DTC calibration system may generate a function other than a piecewise linear function to calibrate a DTC for particular DTC inputs values.

Figure 3:
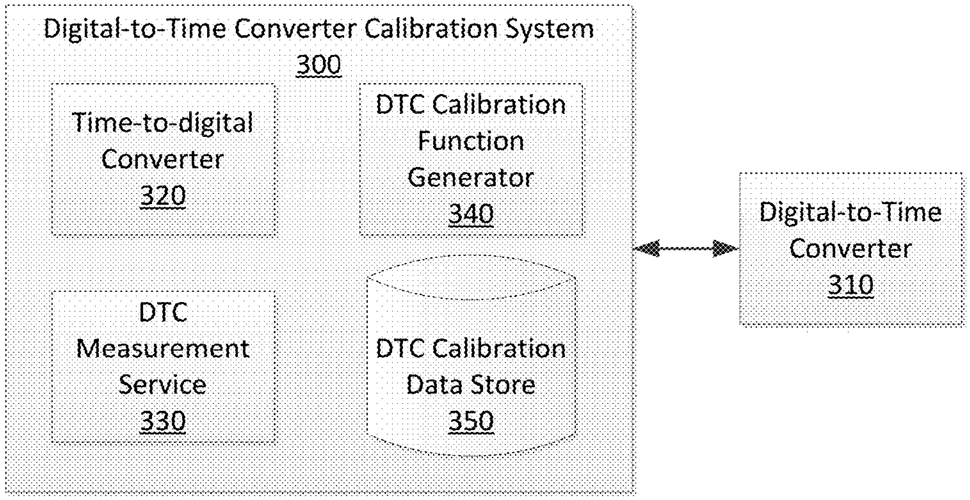
FIG. 3 is a block diagram illustrating exemplary components of an electronic device implementing aspects of the disclosure, according to an exemplary implementation.

FIG. 3 is a block diagram depicting an example DTC calibration system 300, according to an exemplary implementation. The DTC calibration system 300 may be operatively coupled to a DTC 310. For example, the DTC calibration system 300 may provide DTC inputs to the DTC and receive an output to the DTC.

In some exemplary implementations, the DTC calibration system 300 includes a TDC 320, a DTC measurement service 330, a DTC calibration function generator 340 and a DTC calibration data store 350. In some exemplary implementations, the DTC calibration system 300 may include fewer or additional components than shown in FIG. 3. Furthermore, in some exemplary implementations, one or more of the components of the DTC calibration system 300 may be combined with other components or may be separated into additional components.

The DTC calibration system 300 may generate a DTC input to provide to the DTC 310. In some exemplary implementations, the DTC measurement service 330 may provide generate and provide the DTC input to the DTC 310. The DTC 310 may generate an output based on the DTC input and a reference clock. The DTC calibration system 300 may receive the output from the DTC 310 and determine whether the phase of the output corresponds to a threshold of the TDC. For instance, to determine a DTC input that generates an output corresponding to a TDC threshold that is being tested, the DTC measurement service 330 may provide a first DTC input to the DTC 310. The TDC may then generate an output based on the length of time of the phase offset of the output. For instance, the TDC may increase its output as the length of the phase offset passes known threshold lengths of time of the TDC. If the TDC output is lower than the TDC threshold that is being tested, then the DTC measurement service 330 may provide a DTC input that provides longer phase offset. If the TDC output is higher than the TDC threshold that is being tested, then the DTC measurement service 330 may provide a DTC input that provides a shorter phase offset. If the TDC output is the same as the TDC threshold that is being tested, then the DTC measurement service 330 may provide a DTC input that provides a shorter phase offset in order to find a DTC input that more accurately matches the tested TDC threshold.

The DTC measurement service 330 may continue to provide different DTC inputs to a DTC 310 until it finds a value for a DTC input that corresponds to the TDC threshold that is being tested. In order to determine a DTC input to provide to the DTC, the DTC measurement service may perform a search to determine a next DTC input. For example, the first DTC input used to measure a TDC threshold may be determined based on calculating an expected DTC input value, randomly, at a midpoint, maximum, or minimum value, or based on other criteria. The DTC measurement service 330 may then determine a next DTC input to use based on set rules. In some exemplary implementations, the DTC measurement service 330 may perform a linear search. For example, the next DTC input value may be incremented higher or lower based on TDC output. In some exemplary implementations, the DTC measurement service 330 may perform a binary search of possible DTC inputs. For example, the DTC measurement service 330 may select a next DTC input value that is higher or lower than a previous DTC input value by taking the midpoint of values between two previous DTC input values (or the first DTC input value and a maximum or minimum input value). In order to identify the threshold, the binary search may treat a matched TDC output as being lower than the target of the binary search. In some exemplary implementations, the DTC measurement service may sweep the possible DTC input values and determine a first DTC input value that is after the tested threshold of the TDC. In some exemplary implementations, the DTC measurement service 330 may include a circuit that identifies a DTC input value corresponding to a known TDC threshold. For example, the circuitry may be as described with reference to FIG. 5.

The process of identifying a DTC input corresponding to a TDC threshold may be repeated for each (or a subset) of the known TDC thresholds. The DTC inputs identified by the DTC measurement service 330 may be stored in a DTC calibration data store 350 with an indication of the corresponding TDC threshold. After the DTC measurement service 330 identifies DTC inputs corresponding to each (or a subset) of the known TDC thresholds, the DTC calibration function generator 340 may determine a calibration function for the DTC. For instance, the DTC calibration function generator 340 may determine a piecewise linear function based on the measured points. In some exemplary implementations, the DTC calibration function generator 340 may then use the generated function to identify a phase output corresponding to each of the DTC inputs. In some exemplary implementations, the DTC calibration system 300 may store the pairs of DTC inputs and phase outputs in the DTC calibration data store 350. A system, such as a mobile device or other computing device, may then use the data in the DTC calibration data store 350 to determine a DTC input that will generate a desired phase offset of a DTC output.

Figure 4:
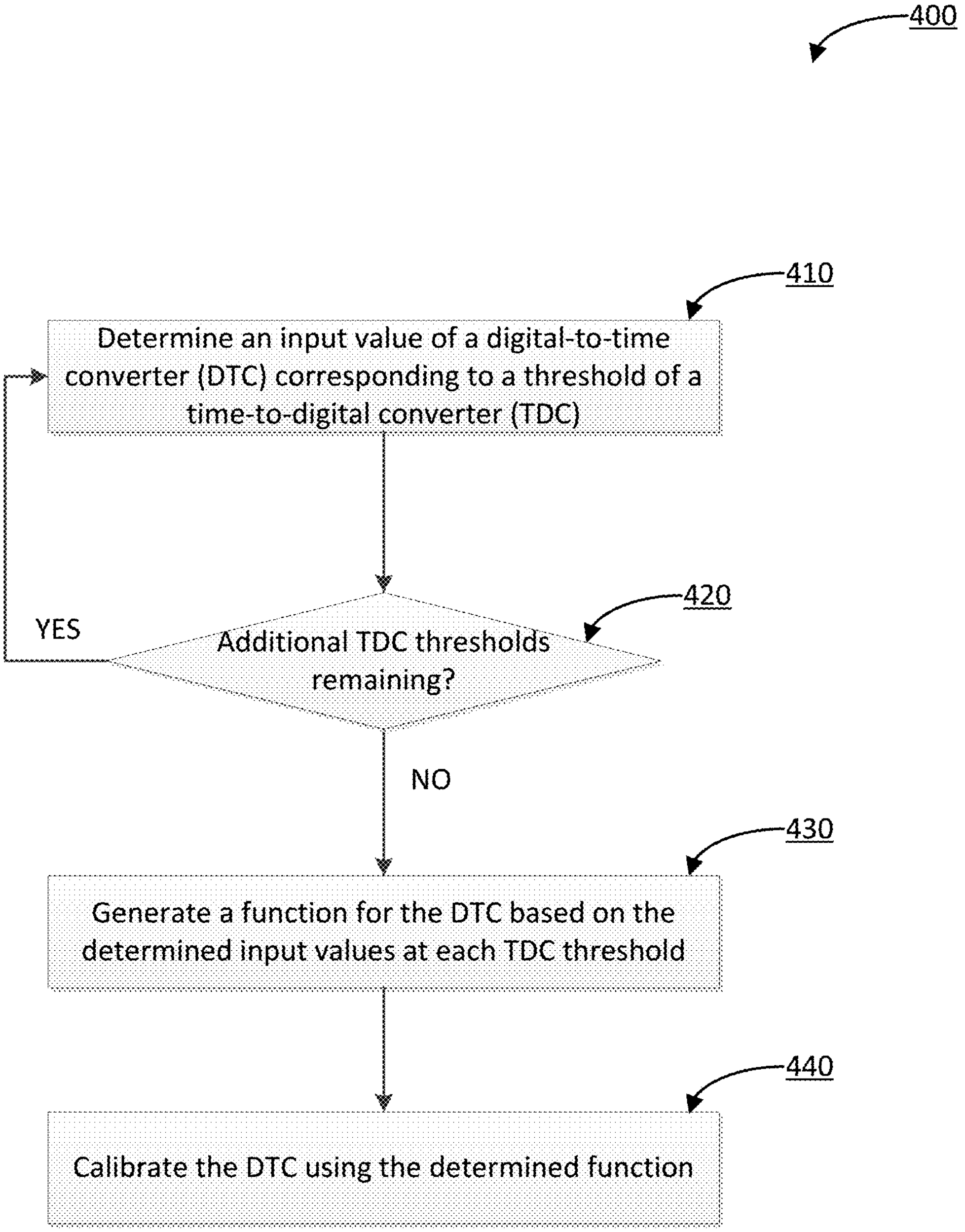
FIG. 4 is a flow diagram depicting a method for calibrating a DTC, according to an exemplary implementation.

FIG. 4 is a flow diagram depicting a method 400 for calibrating a DTC, according to an exemplary implementation. Beginning in block 410, a DTC calibration system determines an input value of a DTC corresponding to a threshold of a TDC. The threshold of the TDC may be a known value that represents a particular amount of time. The amount of time associated the known threshold may be used to determine a phase offset of the DTC. In some exemplary implementations, the DTC input value may be determined using a feedback circuit or a processing device performing a search of DTC inputs to find the DTC input that corresponds to the threshold.

In block 420, the DTC calibration system determines if there are additional TDC thresholds remaining for which a DTC input has not been determined. If there are additional TDC inputs to be tested, the DTC calibration system may return to block 410 and determine another DTC input that corresponds to the next TDC threshold. If there are not additional TDC thresholds to be tested, then the DTC calibration system may continue to block 430.

In block 430, the DTC calibration system generates a calibration function for the DTC based on the determined DTC input values at each measured TDC threshold. For instance, the generated function may be a piecewise linear function between each of the TDC thresholds. In some exemplary implementations, other types of functions may be generated, such as other piecewise functions between the TDC thresholds. In some exemplary implementations, the generated function may be a linear regression generated using the TDC threshold, or another continuous function generated based on the DTC input values at the TDC threshold.

In block 440, the DTC calibration system calibrates the DTC using the determined function. In some exemplary implementations, calibration the DTC comprises storing data indicating the DTC input value corresponding to different phase offsets. The input values corresponding to different phase offsets may be determined using the generated function. In some exemplary implementations, the DTC calibration system may calibrate the DTC by using the function to determine DTC inputs corresponding to different offsets as the phase offsets are provided to the DTC calibration system.

Figure 5:
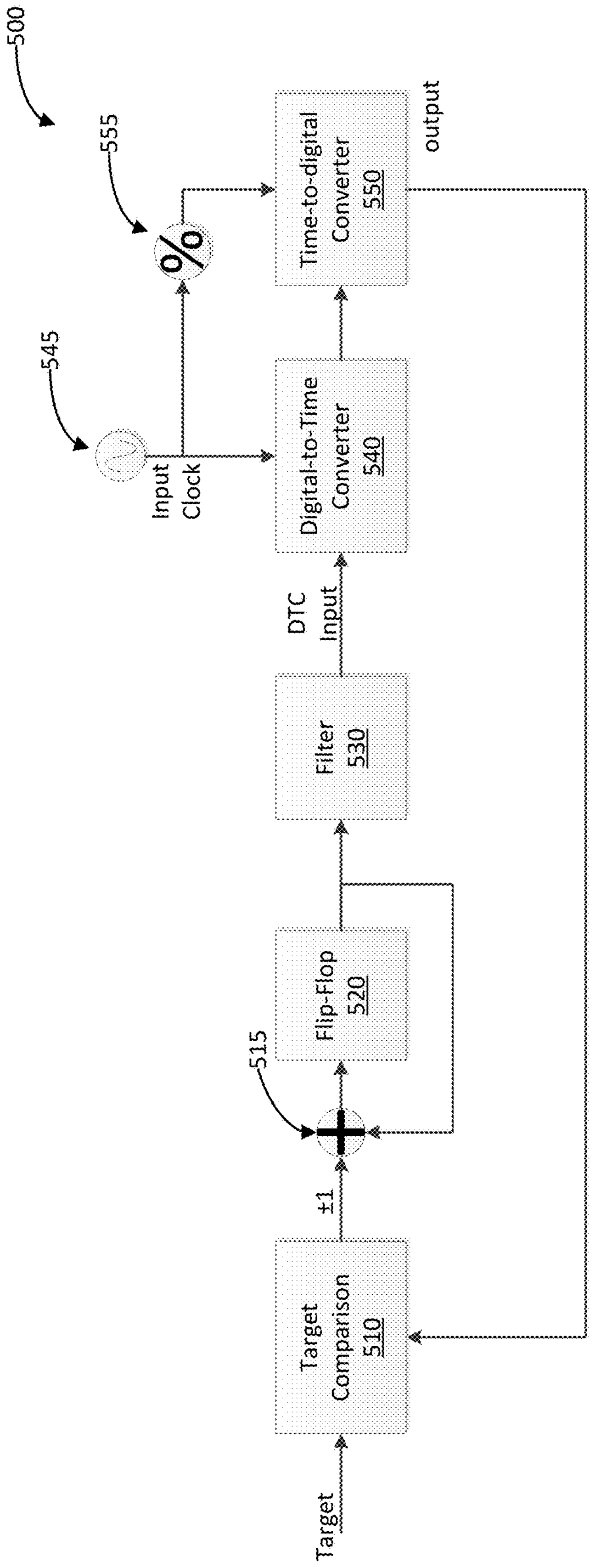
FIG. 5 is a block diagram of a feedback loop to determine a DTC input corresponding to a TDC threshold, according to an exemplary implementation.

FIG. 5 is a block diagram of a feedback loop to determine a DTC input corresponding to a TDC threshold, according to an exemplary implementation. In the feedback loop shown in FIG. 5, a DTC 540 is being calibrated using a TDC 550 that is at a lower resolution than the DTC 540. For example, in some exemplary implementations, the TDC 550 may have a resolution of approximately 3-5 ps, while the DTC 540 may have a resolution of less than 1 ps. In some exemplary implementations, the DTC 540 and TDC 550 may have different resolutions.

The DTC 540 may generate an output signal based on a DTC input and a clock signal received from a DTC input clock 545. The output of the DTC 540 may be at a different frequency than the DTC input clock signal and may be at a phase offset compared to the DTC input clock 545. The DTC input clock 545 may also be operatively coupled to a frequency divider 555 that changes the frequency of the DTC input clock 545. The frequency divider 555 may be configured such that the output of the frequency divider has the same frequency of the output of the DTC 540. However, the frequency divider 555 does not change the phase offset of the input clock signal.

The TDC 550 may then receive a clock signal from the output of the frequency divider 555 and an output signal from the DTC 540. The TDC 550 may generate an output in response to the time difference between receiving an input from the DTC input clock 545 and an input from the DTC 540. Thus, the TDC 550 may provide an output corresponding to a threshold time period that is passed by offset of the DTC 540.

The output of the TDC 550 may then be provided to a target comparison circuit 510. The target comparison circuit may determine if the output of the TDC 550 matches a target output for a TDC threshold that is being tested. For instance, if the target output is n, corresponding to an nth known threshold for the TDC 550, then the target and the output from the TDC may be considered to match. The target comparison circuit 510 may increase or decrease a DTC input based on the comparison. If the output of the TDC 550 is lower than the target, then the target comparison circuit 510 may output a positive 1 value to increase the DTC input (and thus increase the phase offset). If the output of the TDC 550 is higher than the target, then the target comparison circuit 510 may output a negative 1 value to decrease the DTC input (and thus decrease the phase offset). If the output of the TDC 550 is the same as the target, then the target comparison circuit 510 may output a negative 1 value to decrease the DTC input. This may be done to test if there is a lower DTC input that would still produce the same TDC output.

The output of the target comparison circuit 510 may be integrated by adding the output using an addition circuit 515 and a flip-flop 520. Accordingly, the target comparison circuit 510 may increase or decrease the DTC input word by adding to or subtracting from a total stored in flip-flop 520. A filter 530 may also be included in circuit 500 to ensure a clear signal is provided to DTC 540.

The circuit 500 may be controlled by, or be a part of, a DTC calibration system. For instance, the DTC calibration system in FIG. 3 may include the circuit 500 as part of a DTC measurement service 330. The circuit 500 may be used at different target values to determine a DTC input value corresponding to each target threshold of the TDC 550. In some exemplary implementations, the circuit 500 may run for a set amount of time or number of cycles to determine the DTC input word corresponding to a TDC threshold. In some exemplary implementations, a control system may monitor the DTC input to determine when it reaches a steady state and may use that DTC input as the determine DTC input for a TDC threshold.

Figure 6:
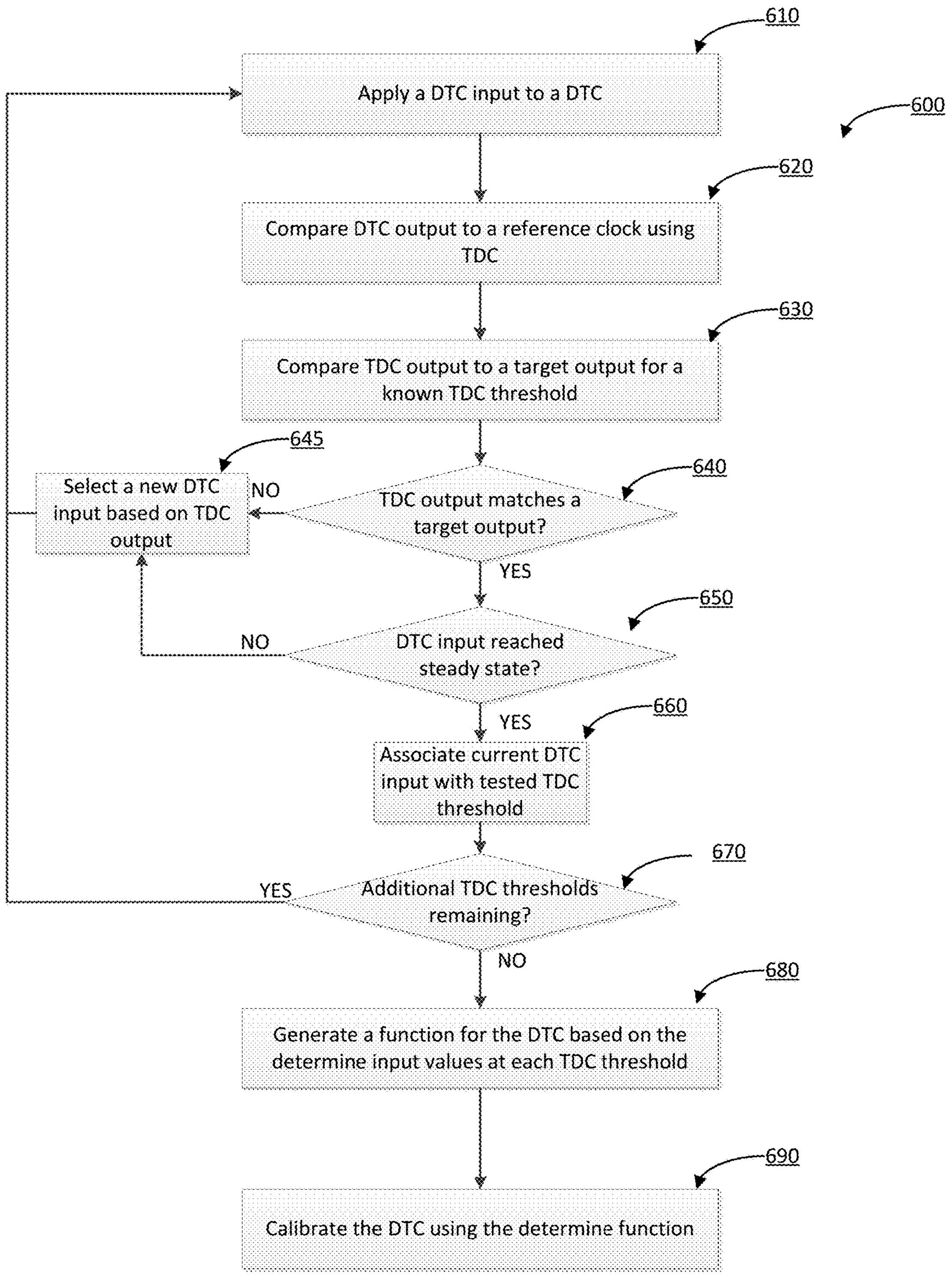
FIG. 6 is a flow diagram depicting a method for calibrating a DTC, according to an exemplary implementation.

FIG. 6 is a flow diagram depicting a method 600 for calibrating a DTC, according to an exemplary implementation. Beginning in block 610, a DTC calibration system applies a DTC input to a DTC. In block 620, the DTC calibration system compares the DTC output to a reference clock using a TDC. The TDC may then generate an output based on a time difference representing the phase offset between the clock and the DTC input.

In block 630 the DTC calibration system compares the output of the TDC to a known TDC threshold that is being tested. For example, the DTC calibration system may determine if the value of the output is higher, lower, or the same as a known threshold. Based on the comparison, in block 640, the DTC calibration system determines if a TDC output matches a target output. If the TDC output does not match the target output, the method 600 may continue to block 645 to select a new DTC input based on the comparison. For instance, the DTC input may be increased or decreased based on the TDC output being higher or lower than the TDC threshold that is being tested. In some exemplary implementations, the DTC calibration system may increase or decrease the DTC input based on a binary search algorithm, a linear search algorithm, an exponential search algorithm, an interpolation search algorithm, or any other search algorithm of potential DTC inputs. In some exemplary implementations, the TDC input may be increased or decreased by a circuit such as described with reference to FIG. 5.

If in block 640, the DTC calibration system determines that the TDC output matches a target, then the process may continue to block 650. In block 650, the DTC calibration system may determine whether the DTC input has reached a steady state. For example, if the TDC output matched the target for a first time, the DTC calibration system may attempt to find a DTC input with a lower value that also produces a TDC output at the target threshold. If the TDC output has matched previously and the DTC calibration system has determined that a lower DTC input produces a different TDC output, then the DTC may be considered to have reached a steady state. If the DTC calibration system determines in block 650 that the DTC input is not in a stead state, then the process may continue to block 645 to determine a different DTC input to test. If the DTC calibration system determine in block 650 that the DTC input has reached a steady state, the process may continue to block 660.

In block 660, the DTC calibration system associates the current DTC input with the tested TDC threshold. For example, the DTC calibration system may store a record that the DTC input word that was last provided to the DTC generates a phase offset that corresponds to the tested TDC threshold. In some exemplary implementations, the DTC input and TDC threshold may be associated in other ways.

In block 670, the DTC calibration system determines if there are additional TDC thresholds remaining for which a DTC input has not been determined. If there are additional TDC inputs to be tested, the DTC calibration system may return to block 610 and provide a new DTC input to a DTC and continue through the method to test the next TDC threshold. If there are not additional TDC thresholds to be tested, then the DTC calibration system may continue to block 680.

In block 680, the DTC calibration system generates a calibration function for the DTC based on the determined DTC input values at each measured TDC threshold. For instance, the generated function may be a piecewise linear function between each of the TDC thresholds. In some exemplary implementations, other types of functions may be generated, such as other piecewise functions between the TDC thresholds. In some exemplary implementations, the generated function may be a linear regression generated using the TDC threshold, or another continuous function generated based on the DTC input values at the TDC threshold.

In block 690, the DTC calibration system calibrates the DTC using the determined function. In some exemplary implementations, calibration the DTC comprises storing data indicating the DTC input value corresponding to different phase offsets. The input values corresponding to different phase offsets may be determined using the generated function. In some exemplary implementations, the DTC calibration system may calibrate the DTC by using the function to determine DTC inputs corresponding to different offsets as the phase offsets are provided to the DTC calibration system.

The following examples pertain to further exemplary implementations of the disclosure.

Example 1 is system for calibration comprising: a digital-to-time converter (DTC) to generate output signals with phase offsets determined by a plurality of DTC input values; a time-to-digital converter (TDC) operatively coupled to the DTC, wherein the TDC has a lower resolution than the DTC; and a processing component operatively coupled to the DTC and the TDC, the processing component to: for each of a plurality of TDC thresholds, determine a DTC input value corresponding to a respective TDC threshold; and generate a calibration function based on the determined DTC input values and corresponding TDC thresholds.

In example 2, in the system of example 1 the processing component is further to interpolate a set of phase offsets generated by a set of DTC input values that are different from one of the plurality of TDC thresholds using the calibration function.

In example 3, in the system of example 1 to generate a calibration function, the processing component is further to: determine a difference between a first DTC input corresponding to a first TDC threshold and a second DTC input corresponding to a second TDC threshold; and generate a component of a piecewise linear function based on the difference between the first DTC input and the second DTC input.

In example 4, in the system of example 1, to determine the DTC input value corresponding to a respective TDC threshold, the processing component is further to: provide a test DTC input value to a DTC; determine that a TDC output generated based on the test DTC input value is lower than a target TDC output; and increase a test DTC input value provided to the DTC.

In example 5, in the system of example 1 to determine the DTC input value corresponding to a respective TDC threshold, the processing component is further to: perform a search of potential DTC input values based on TDC outputs, wherein the search is one of a binary search, a linear search, an exponential search, or an interpolation search.

In example 6, in the system of example 1 to determine the DTC input value corresponding to a respective TDC threshold, the processing component is further to: performing a first sweep of DTC input values to determine a first DTC input value corresponding to the respective TDC threshold; performing a second sweep of DTC input values to determine a second DTC input value corresponding to the respective TDC threshold; and determining the DTC input value corresponding to the respective TDC based on the average of the first DTC input value and the second DTC input value.

In example 7, the system of example 1 further comprises baseband circuitry operatively coupled to the DTC, wherein the baseband circuitry is to: determine a first phase offset to be used for phase modulation of a signal; and determine a first DTC input corresponding to the first phase output based on the calibration function.

Example 8 is an apparatus comprising: a digital-to-time converter (DTC) to generate output signals with phase offsets set by an input value; a time-to-digital converter (TDC) operatively coupled to the DTC, wherein the TDC has a lower resolution than the DTC; and a processing component operatively coupled to the DTC and the TDC, the processing component to: determine a first DTC input value corresponding to a first TDC threshold; determine a second DTC input value corresponding to a second TDC threshold; and generate a portion of a calibration function based on the first DTC input value and the second DTC input value, wherein the calibration function estimates DTC input values corresponding to phase offsets different from the first TDC threshold and the second TDC threshold.

In example 9, in the apparatus of example 8 to generate the calibration function, the processing component is further to: determine a difference between the first DTC input corresponding to the first TDC threshold and the second DTC input corresponding to the second TDC threshold; and generate a component of a piecewise linear function based on the difference between the first DTC input and the second DTC input.

In example 10, in the apparatus of example 8 to determine the first DTC input value corresponding to the first TDC threshold, the processing component is further to: provide a test DTC input value to the DTC; determine that a TDC output generated based on the test DTC input value is lower than a target TDC output; and increase the test DTC input value provided to the DTC.

In example 11, in the apparatus of example 8 to determine the first DTC input value corresponding to the first TDC threshold, the processing component is further to perform a search of potential DTC input values based on TDC outputs, wherein the search is one of a binary search, a linear search, an exponential search, or an interpolation search.

In example 12, in the apparatus of example 8 to determine the first DTC input value corresponding to the first TDC threshold, the processing component is further to: perform a first sweep of DTC input values to determine a third DTC input value corresponding to the first TDC threshold; perform a second sweep of DTC input values to determine a fourth DTC input value corresponding to the first TDC threshold; and determine the first DTC input value corresponding to the first TDC based on the average of the third DTC input value and the fourth DTC input value.

In example 13, in the apparatus of example 8 the processing component is further to interpolate a set of phase offsets generated by a set of DTC input values that do not correspond to the first TDC threshold or the second TDC threshold.

In example 14, in the apparatus of example 8 the processing component is further to: determine additional DTC input values each corresponding to one of a set of remaining TDC thresholds; and update the calibration function based on the additional DTC input values.

In example 15, in the apparatus of example 14 the processing component is further to calculate a phase offset corresponding to a third DTC input value using the calibration function, wherein the phase offset does not correspond to a threshold of the TDC.

Example 16 is a method comprising: determining a first input value for a digital-to-time converter (DTC) that corresponds to a first threshold of a time-to-digital converter (TDC), wherein the DTC has a higher resolution than the TDC; determining a second input value for the DTC corresponding to a second threshold of the TDC; and generating, by a processing component, a portion of a calibration function based on the first input value and the second input value, wherein the calibration function estimates input values corresponding to a phase offsets that are different from the first threshold or the second threshold.

In example 17, in the method of example 16 generating the portion of the calibration function comprises: determining a difference between the first DTC input corresponding to the first TDC threshold and the second DTC input corresponding to the second TDC threshold; and generating a component of a piecewise linear function based on the difference between the first DTC input and the second DTC input.

In example 18, in the method of example 16 determining the first input value corresponding to the first threshold comprises: providing a test input value to the DTC; determining that a TDC output generated based on the test DTC input value is higher than a target TDC output; and decreasing test DTC input value provided to the DTC.

In example 19, in the method of example 16 determining the first input value corresponding to the first threshold comprises: providing a test input value to the DTC; determining that a TDC output generated based on the test DTC input value matches a target TDC output; and decreasing test DTC input value provided to the DTC.

In example 20, in the method of example 16 determining the first input value corresponding to the first threshold comprises performing a search of potential DTC input values based on values output from the DTC, wherein the search is one of a binary search, a linear search, an exponential search, or an interpolation search.

In example 21, the method of example 16 further comprises determining a first phase offset to be used for phase modulation of a signal; and determining a first DTC input corresponding to the first phase output based on the calibration function.

Example 22 is an apparatus comprising means to perform a method as claimed in any of claims 16 to 21.

Example 23 is a machine-readable storage including machine-instructions that, when executed, cause an apparatus to perform a method as claimed in any of claims 16 to 21.

Example 24 is an apparatus comprising: means for determining a first input value for a digital-to-time converter (DTC) that corresponds to a first threshold of a time-to-digital converter (TDC), wherein the DTC has a higher resolution than the TDC; means for determining a second input value for the DTC corresponding to a second threshold of the TDC; and means for generating, by a processing component, a portion of a calibration function based on the first input value and the second input value, wherein the calibration function estimates input values corresponding to a phase offsets that are different from the first threshold or the second threshold.

In example 25, in the apparatus of claim 23, the means for generating the portion of the calibration function comprises: means for determining a difference between the first DTC input corresponding to the first TDC threshold and the second DTC input corresponding to the second TDC threshold; and means for generating a component of a piecewise linear function based on the difference between the first DTC input and the second DTC input.

In example 26, in the apparatus of claim 23, the means for determining the first input value corresponding to the first threshold comprises: means for providing a test input value to the DTC; means for determining that a TDC output generated based on the test DTC input value is higher than a target TDC output; and means for decreasing test DTC input value provided to the DTC.

In example 27, in the apparatus of claim 23, the means for determining the first input value corresponding to the first threshold comprises: means for providing a test input value to the DTC; means for determining that a TDC output generated based on the test DTC input value matches a target TDC output; and means for decreasing test DTC input value provided to the DTC.

In example 28, in the apparatus of claim 23, the means for determining the first input value corresponding to the first threshold comprises performing a search of potential DTC input values based on values output from the DTC, wherein the search is one of a binary search, a linear search, an exponential search, or an interpolation search.

In example 29, in the apparatus of claim 23, further comprises means for determining a first phase offset to be used for phase modulation of a signal; and means for determining a first DTC input corresponding to the first phase output based on the calibration function.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

Instructions used to program logic to perform implementations of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one exemplary implementation, refers to the hardware, which is specifically configured to recognize and/or execute the code to be held on a non-transitory medium. Furthermore, in another exemplary implementation, use of a module refers to the non-transitory medium including the code, which is specifically adapted to be executed by the microcontroller to perform predetermined operations. And as can be inferred, in yet another exemplary implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one exemplary implementation, use of the term logic includes hardware, such as transistors, registers, or other hardware, such as programmable logic devices.

Use of the phrase 'configured to,' in one exemplary implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focuses on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one exemplary implementation, refers to some apparatus, logic, hardware, and/or element designed in such a way to enable use of the apparatus, logic, hardware, and/or element in a specified manner. Note as above that use of to, capable to, or operable to, in one exemplary implementation, refers to the latent state of an apparatus, logic, hardware, and/or element, where the apparatus, logic, hardware, and/or element is not operating but is designed in such a manner to enable use of an apparatus in a specified manner.

The exemplary implementations of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform implementations of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one implementation," "an implementation," "one exemplary implementation," "an exemplary implementation," or "some exemplary implementation," means that a particular feature, structure, or characteristic described in connection with the implementation is included in at least one implementation of the present disclosure. Thus, the appearances of the phrases "in one implementation," "in an implementation," "in some implementations," or the like in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation and other exemplarily language does not necessarily refer to the same implementation or the same example, but may refer to different and distinct implementations, as well as potentially the same implementation.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "selecting," "receiving," "determining," "generating," "measuring," "calculating," "setting," "identifying," "executing," "transmitting," "communicating," "accessing," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. A system for calibration comprising:

a digital-to-time converter (DTC) to generate output signals with phase offsets determined by a plurality of DTC input values;

a time-to-digital converter (TDC) operatively coupled to the DTC, wherein the TDC has a lower resolution than the DTC; and a processing component operatively coupled to the DTC and the TDC, the processing component to:

for each of a plurality of TDC thresholds, determine a DTC input value corresponding to a respective TDC threshold; and generate a calibration function based on the determined DTC input values and corresponding TDC thresholds.

2. The system of claim 1, wherein the processing component is further to interpolate a set of phase offsets generated by a set of DTC input values that are different from one of the plurality of TDC thresholds using the calibration function.

3. The system of claim 1, wherein to generate a calibration function, the processing component is further to:

determine a difference between a first DTC input value corresponding to a first TDC threshold and a second DTC input input corresponding to a second TDC threshold; and generate a component of a piecewise linear function based on the difference between the first DTC input value and the second DTC input value.

4. The system of claim 1, wherein determining the DTC input value corresponding to a respective TDC threshold, the processing component is further to:

provide a test DTC input value to a DTC;

determine that a TDC output generated based on the test DTC input value is lower than a target TDC output; and increase a test DTC input value provided to the DTC.

5. The system of claim 1, wherein to determine the DTC input value corresponding to a respective TDC threshold, the processing component is further to: perform a search of potential DTC input values based on TDC outputs, wherein the search is one of a binary search, a linear search, an exponential search, or an interpolation search.

6. The system of claim 1, wherein to determine the DTC input value corresponding to a respective TDC threshold, the processing component is further to:

performing a first sweep of DTC input values to determine a first DTC input value corresponding to the respective TDC threshold;

performing a second sweep of DTC input values to determine a second DTC input value corresponding to the respective TDC threshold; and determining the DTC input value corresponding to the respective TDC based on an average of the first DTC input value and the second DTC input value.

7. The system of claim 1, further comprising baseband circuitry operatively coupled to the DTC, wherein the baseband circuitry is to:

determine a first phase offset to be used for phase modulation of a signal; and determine a first DTC input value corresponding to the first phase offset based on the calibration function.

8. An apparatus comprising:

a digital-to-time converter (DTC) to generate output signals with phase offsets set by an input value;

a time-to-digital converter (TDC) operatively coupled to the DTC, wherein the TDC has a lower resolution than the DTC; and a processing component operatively coupled to the DTC and the TDC, the processing component to:

determine a first DTC input value corresponding to a first TDC threshold;

determine a second DTC input value corresponding to a second TDC threshold; and generate a portion of a calibration function based on the first DTC input value and the second DTC input value, wherein the calibration function estimates DTC input values corresponding to phase offsets different from the first TDC threshold and the second TDC threshold.

9. The apparatus of claim 8, wherein to generate the calibration function, the processing component is further to:

determine a difference between the first DTC input value corresponding to the first TDC threshold and the second DTC input value corresponding to the second TDC threshold; and generate a component of a piecewise linear function based on the difference between the first DTC input value and the second DTC input value.

10. The apparatus of claim 8, wherein to determine the first DTC input value corresponding to the first TDC threshold, the processing component is further to:

provide a test DTC input value to the DTC;

determine that a TDC output generated based on the test DTC input value is lower than a target TDC output; and increase the test DTC input value provided to the DTC.

11. The apparatus of claim 8, wherein to determine the first DTC input value corresponding to the first TDC threshold, the processing component is further to perform a search of potential DTC input values based on TDC outputs, wherein the search is one of a binary search, a linear search, an exponential search, or an interpolation search.

12. The apparatus of claim 8, wherein to determine the first DTC input value corresponding to the first TDC threshold, the processing component is further to:

perform a first sweep of DTC input values to determine a third DTC input value corresponding to the first TDC threshold;

perform a second sweep of DTC input values to determine a fourth DTC input value corresponding to the first TDC threshold; and determine the first DTC input value corresponding to the first TDC threshold based on an the average of the third DTC input value and the fourth DTC input value.

13. The apparatus of claim 8, wherein the processing component is further to interpolate a set of phase offsets generated by a set of DTC input values that do not correspond to the first TDC threshold or the second TDC threshold.

14. The apparatus of claim 8, wherein the processing component is further to:

determine additional DTC input values each corresponding to one of a set of remaining TDC thresholds; and update the calibration function based on the additional DTC input values.

15. The apparatus of claim 13, wherein the processing component is further to calculate a phase offset corresponding to a third DTC input value using the calibration function, wherein the phase offset does not correspond to a threshold of the TDC.

16. A method comprising:

determining a first input value for a digital-to-time converter (DTC) that corresponds to a first threshold of a time-to-digital converter (TDC), wherein the DTC has a higher resolution than the TDC;

determining a second input value for the DTC corresponding to a second threshold of the TDC; and generating, by a processing component, a portion of a calibration function based on the first input value and the second input value, wherein the calibration function estimates input values corresponding to a phase offsets that are different from the first threshold or the second threshold.

17. The method of claim 16, wherein generating the portion of the calibration function comprises:

determining a difference between the first input value corresponding to the first threshold and the second input value corresponding to the second threshold; and generating a component of a piecewise linear function based on the difference between the first input value and the second input value.

18. The method of claim 16, wherein determining the first input value corresponding to the first threshold comprises:

providing a test input value to the DTC;

determining that a TDC output generated based on the test input value is higher than a target TDC output; and decreasing the test input value provided to the DTC.

19. The method of claim 16, wherein determining the first input value corresponding to the first threshold comprises:

providing a test input value to the DTC;

determining that a TDC output generated based on the test input value matches a target TDC output; and decreasing the test input value provided to the DTC.

20. The method of claim 16, further comprising:

determining a first phase offset to be used for phase modulation of a signal; and determining a first DTC input corresponding to the first phase offset based on the calibration function.

* * * * *